(12) United States Patent
Munehiro et al.

(10) Patent No.: US 9,033,718 B2
(45) Date of Patent: May 19, 2015

(54) CONTROL APPARATUS

(71) Applicant: KABUSHIKI KAISHA YASKAWA DENKI, Kitakyushu-shi (JP)

(72) Inventors: Naoto Munehiro, Kitakyushu (JP); Hajime Uesugi, Kitakyushu (JP); Michinori Kusumi, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 91 days.

(21) Appl. No.: 13/874,490

(22) Filed: May 1, 2013

(65) Prior Publication Data
US 2013/0244461 A1 Sep. 19, 2013

Related U.S. Application Data

(63) Continuation of application No. PCT/JP2011/068788, filed on Aug. 19, 2011.

(30) Foreign Application Priority Data

Nov. 5, 2010 (JP) ................................ 2010-248739

(51) Int. Cl.
| | |
|---|---|
| H01R 13/52 | (2006.01) |
| H01R 13/639 | (2006.01) |
| H05K 5/02 | (2006.01) |
| H05K 7/14 | (2006.01) |

(52) U.S. Cl.
CPC ........ *H01R 13/5213* (2013.01); *H01R 13/6395* (2013.01); *H05K 5/0239* (2013.01); *H05K 5/0286* (2013.01); *H05K 7/1481* (2013.01)

(58) Field of Classification Search
CPC .................................................. H01R 13/5213
USPC .......................... 439/136, 142, 147, 521, 536
See application file for complete search history.

(56) References Cited

U.S. PATENT DOCUMENTS

| | | | |
|---|---|---|---|
| 5,288,945 A | | 2/1994 | Bruce |
| 5,483,419 A | * | 1/1996 | Kaczeus et al. .......... 361/679.39 |
| 5,603,623 A | * | 2/1997 | Nishikawa et al. ........... 439/144 |
| 5,735,701 A | * | 4/1998 | Jarrett ........................... 439/147 |

(Continued)

FOREIGN PATENT DOCUMENTS

| | | |
|---|---|---|
| DE | 3327087 C1 | 8/1984 |
| JP | 09-147980 | 6/1997 |

(Continued)

OTHER PUBLICATIONS

Korean Office Action for corresponding KR Application No. 2013-7011365, Apr. 29, 2014.

(Continued)

*Primary Examiner* — James Harvey
(74) *Attorney, Agent, or Firm* — Mori & Ward, LLP

(57) ABSTRACT

A control apparatus includes a port, an openable and closable door, and a holding mechanism. A connector of the USB device is insertable into and removable from the port so as to connect and disconnect the USB device to and from the control apparatus. The openable and closable door is disposed adjacent the port, and configured to open so as to expose the port and configured to close so as to shield the port. The holding mechanism is disposed at the openable and closable door and configured to hold a housing of the USB device when the openable and closable door is open.

20 Claims, 17 Drawing Sheets

(56) References Cited

U.S. PATENT DOCUMENTS

| | | | |
|---|---|---|---|
| 6,544,061 B1 * | 4/2003 | Yasufuku et al. | 439/310 |
| 6,666,703 B2 | 12/2003 | Takeuchi | |
| 7,364,458 B1 * | 4/2008 | Ju | 439/524 |
| 7,374,454 B1 * | 5/2008 | Wang | 439/536 |
| 2006/0089028 A1 * | 4/2006 | Higham et al. | 439/136 |
| 2010/0227485 A1 * | 9/2010 | Fujita et al. | 439/136 |
| 2013/0244461 A1 * | 9/2013 | Munehiro et al. | 439/136 |
| 2014/0051273 A1 * | 2/2014 | Han et al. | 439/136 |
| 2014/0308838 A1 * | 10/2014 | Kuo | 439/347 |

FOREIGN PATENT DOCUMENTS

| | | |
|---|---|---|
| JP | 2003-151708 | 5/2003 |
| JP | 2005-108597 | 4/2005 |
| JP | 2006-294260 | 10/2006 |
| JP | 2007-220506 | 8/2007 |
| JP | 2009-135034 | 6/2009 |
| JP | 2010-021070 | 1/2010 |
| KR | 10-2010-0008168 | 1/2010 |
| KR | 20100008168 | 1/2010 |

OTHER PUBLICATIONS

Japanese Office Action for corresponding JP Application No. 2012-541768, Dec. 17, 2013.
International Search Report for corresponding International Application No. PCT/JP2011/068788, Nov. 8, 2011.
Written Opinion for corresponding International Application No. PCT/JP2011/068788, Nov. 8, 2011.
Chinese Office Action for corresponding CN Application No. 201180052876.5, Jan. 30, 2015.
Extended European Search Report for corresponding EP Application No. 11837796.9-1801, Dec. 4, 2014.

* cited by examiner

CONTROL APPARATUS

CROSS-REFERENCE TO RELATED APPLICATIONS

The present application is a continuation application of International Application No. PCT/JP2011/068788, filed Aug. 19, 2011, which claims priority to Japanese Patent Application No. 2010-248739, filed Nov. 5, 2010. The contents of these applications are incorporated herein by reference in their entirety.

BACKGROUND OF THE INVENTION

1. Field of the Invention

The present invention relates to a control apparatus.

2. Discussion of the Background

Some control apparatuses are known to receive a USB (Universal Serial Bus) device and transmit data to and from the USB device. A wide variety of devices are available as the USB device. When in use, in some cases the USB device is in connection for a comparatively short period of time, being connected and disconnected frequently, while in other cases the USB device is in connection for a comparatively long period of time. For example, a USB memory, which is a kind of USB device, generally has a comparatively short connection time, being connected and disconnected every time the intended work is done. However, for example, for use in memorizing the situation in which the work is being done for work management or other purposes, the USB memory needs to be held in connected state for a long period of time.

Conventionally known ways to hold the USB memory are disclosed in, for example, Japanese Unexamined Patent Application Publication No. 2006-294260 and Japanese Unexamined Patent Application Publication No. 2010-21070. In Japanese Unexamined Patent Application Publication No. 2006-294260, the USB memory is inserted into the port and then rotated into fixed state. In Japanese Unexamined Patent Application Publication No. 2010-21070, the USB memory is inserted into the port together with a plate material under pressure in an attempt to prevent removal.

SUMMARY OF THE INVENTION

According to one aspect of the present invention, a control apparatus includes a port, an openable and closable door, and a holding mechanism. A connector of the USB device is insertable into and removable from the port so as to connect and disconnect the USB device to and from the control apparatus. The openable and closable door is disposed adjacent the port, and configured to open so as to expose the port and configured to close so as to shield the port. The holding mechanism is disposed at the openable and closable door and configured to hold a housing of the USB device when the openable and closable door is open.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
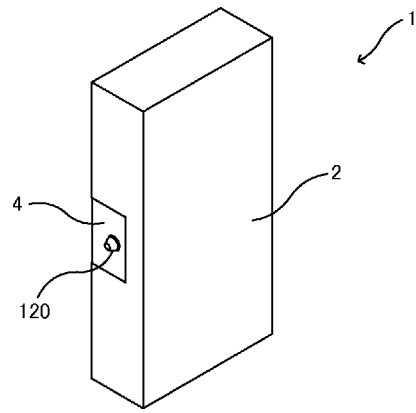
FIGS. 1A to 1C are perspective views of a control apparatus according to a first embodiment, each illustrating an external appearance of the control apparatus.

The embodiments will now be described with reference to the accompanying drawings, wherein like reference numerals designate corresponding or identical elements throughout the various drawings.

First Embodiment

First, by referring to FIGS. 1A to 1C, an external appearance of a control apparatus according to the first embodiment will be described. A control apparatus 1 is a control apparatus that controls a control object, not shown. Examples of the control apparatus 1 include Factory Automation (FA) machines such as a Programmable Logic Controller (PLC). To the control apparatus 1, a Universal Serial Bus (USB) device is connectable and disconnectable so that data is transmitted between the control apparatus 1 and the connected USB device based on a USB standard. In the following description, a USB memory 50, which is a kind of USB device, will be exemplified to be connected to the control apparatus 1.

Figure 1B:
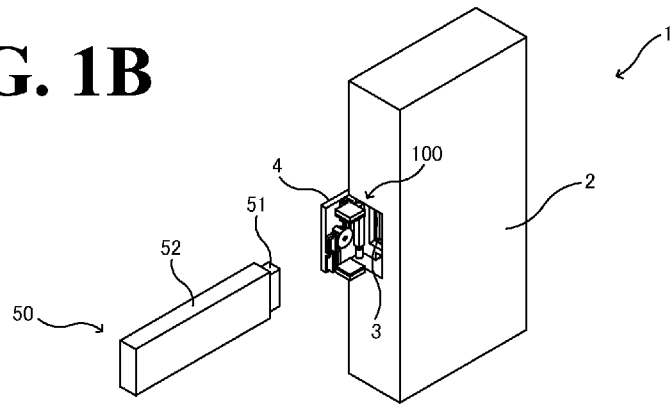
Figure 1C:
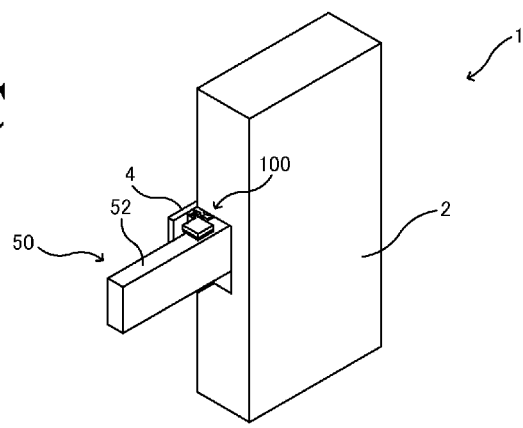

As shown in FIGS. 1A to 1C, a port 3 is disposed on one surface of a housing 2 of the control apparatus 1 (on the left lower side as seen in FIGS. 1A to 1C). The port 3 accepts a connector 51 of the USB memory 50. In the following description, the side on which the port 3 is disposed will be referred to as the front side of the control apparatus 1. Adjacent the front side of the port 3, an openable and closable door 4 is disposed in an openable and closable manner with one side having a hinge structure. When the openable and closable door 4 is open, the openable and closable door 4 exposes the port 3 as shown in FIG. 1B, while when closed, the openable and closable door 4 shields the port 3 as shown in FIG. 1A. Generally, USB ports implemented on Office Automation (OA) machines such as personal computers are exposed. Particularly in environments where FA machines are installed, this leaves a possibility of attachment of dust, oil mist, and other substances to the port, causing electrical short-circuit, communication disturbance, and other occurrences. For dust preventive purposes, the control apparatus 1 is provided with the openable and closable door 4.

As shown in FIG. 1C, the openable and closable door 4 includes a holding mechanism 100 to hold a housing 52 of the USB memory 50 when the openable and closable door 4 is open. As shown in FIG. 1A, the holding mechanism 100 includes a regulation member 120 to regulate movement of slide plates 101, described later, on the outer surface of the openable and closable door 4.

Figure 2A:
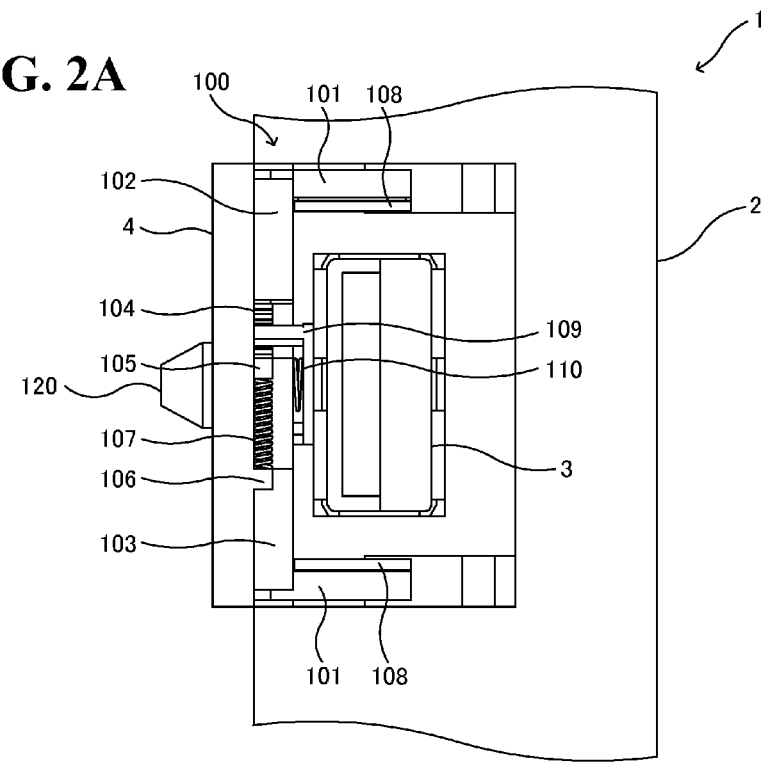
FIGS. 2A and 2B are respectively an enlarged front view and an enlarged side view of a port of the control apparatus with its openable and closable door in open state, illustrating in detail a structure of a holding mechanism according to the first embodiment.
Figure 2B:
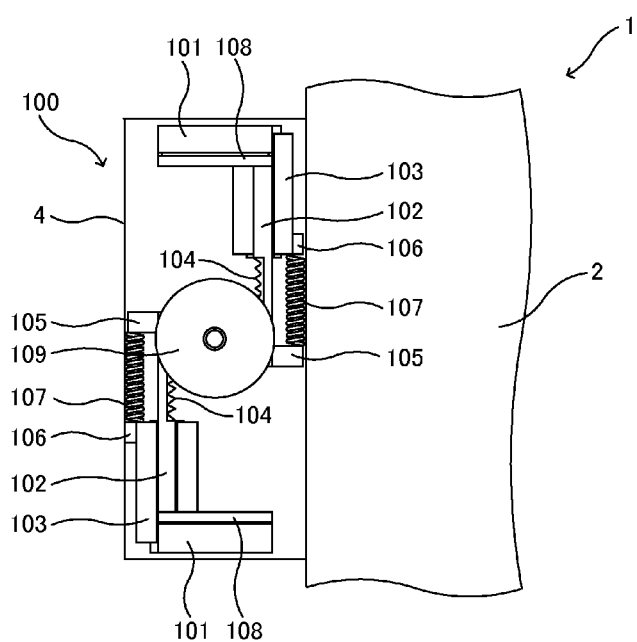

Next, by referring to FIGS. 2A and 2B, a structure of the holding mechanism 100 will be described in detail. As shown in FIGS. 2A and 2B, the holding mechanism 100 includes two slide plates 101 to hold the housing 52 of the USB memory 50 on both sides of the housing 52 so as to support the housing 52. The two slide plates 101 are disposed at one side and the other side (upper side and lower side in the example shown in FIGS. 2A and 2B) of the inner surface of the openable and closable door 4. The slide plates 101 are movable in directions in which they come close to and apart from one another (in the vertical directions in FIGS. 2A and 2B). The slide plates 101 are examples of the holding members recited in the appended claims.

Specifically, each of the slide plates 101 is secured at one end of a corresponding support 102. The support 102 is in slidable contact with a guide 103, which is secured to the inner surface of the openable and closable door 4. On the other end side of the support 102, a rack gear 104 is disposed.

The rack gear 104 meshes with a gear member 121 (see FIGS. 3A to 3C), which is integral with the regulation member 120 across the openable and closable door 4. On the other end of the support 102, a slide-side spring fixing portion 105 is disposed. A spring 107 is disposed between the slide-side spring fixing portion 105 and a door-side spring fixing portion 106, which is disposed at the inner surface of the openable and closable door 4. The spring 107 at any time biases the corresponding slide plate 101 to return to its reference position (the position shown in FIGS. 2A and 2B). The spring 107 is an example of the first biasing unit recited in the appended claims.

The reference positions of the respective slide plates 101 are predetermined at appropriate positions so that the slide plates 101 are within the area of the inner surface of the openable and closable door 4. This enables the openable and closable door 4 to open and close with the slide plates 101 positioned at their respective reference positions. The port 3 is disposed at a further inward position than the surfaces of the housing 2, so that when the openable and closable door 4 is closed, the holding mechanism 100 including the slide plates 101 (but excluding the regulation member 120) is accommodated within the space defined by the inner surface of the openable and closable door 4 and the port 3.

Each of the slide plates 101 includes an elastic member 108 at a portion in contact with the housing 52 of the USB memory 50. The elastic member 108 is made of rubber, elastomer, or similar material. The elastic member 108 eliminates or minimizes slipping of the slide plate 101 and the housing 52. In this embodiment, the housing 52 of the USB memory 50 has a shape that comes into contact with the slide plates 101 in a parallel manner. Even if the housing has a shape that is, for example, inclined relative to the slide plates 101 or has depressions and protrusions, the elastic members 108 can be elastically deformed to reliably hold the housing between the elastic members 108. Thus, the elastic members 108 are capable of holding between them USB devices of a wide variety of shapes, providing improved versatility.

Also at the inner surface of the openable and closable door 4, a presser plate 109 is disposed as if to cover the gear member 121 from behind (from the right side in FIG. 2A and from the front side of the paper surface of FIG. 2B). Between the presser plate 109 and the gear member 121, a presser spring 110 is disposed. The presser spring 110 at any time biases the integrated regulation member 120 and gear member 121 toward the outer surface of the openable and closable door 4.

Next, by referring to FIGS. 3A to 3C, a relationship between the handling of the regulation member 120 and the operation of the slide plates 101 will be described. It is noted that in FIG. 3, the presser plate 109 and the presser spring 110 are not shown for ease of description.

Figure 3A:
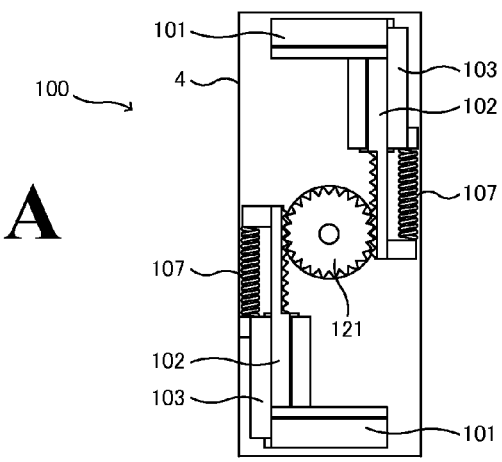
FIGS. 3A to 3C are diagrams each illustrating a relationship between the handling of a regulation member and the operation of slide plates.
Figure 3B:
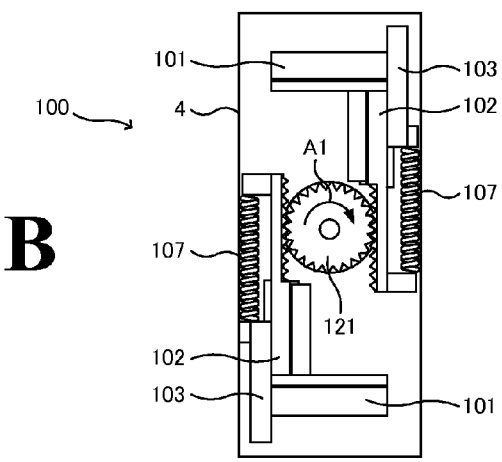

FIG. 3A illustrates a state in which the slide plates 101 are positioned at their respective reference positions. In this state, when an operator turns the regulation member 120 in the anti-clockwise direction (with the openable and closable door 4 seen from outside), the gear member 121 rotates in the clockwise direction (with the openable and closable door 4 seen from inside), as represented by the arrow A1 shown in FIG. 3B. This brings the supports 102 into sliding movement along the guides 103 against the compressive force of the springs 107 as shown in FIG. 3B. That is, the slide plates 101 move in directions in which the slide plates 101 come close to one another, thereby diminishing the distance between the slide plates 101. When the operator turns the regulation member 120 in the clockwise direction (with the openable and closable door 4 seen from outside), the gear member 121 rotates in the anti-clockwise direction (with the openable and closable door 4 seen from inside), as represented by the arrow A2 shown in FIG. 3C. This brings the supports 102 into sliding movement along the guides 103 against the stretching force of the springs 107 as shown in FIG. 3C. That is, the slide plates 101 move in directions in which the slide plates 101 come apart from one another, thereby enlarging the distance between the slide plates 101.

Figure 3C:
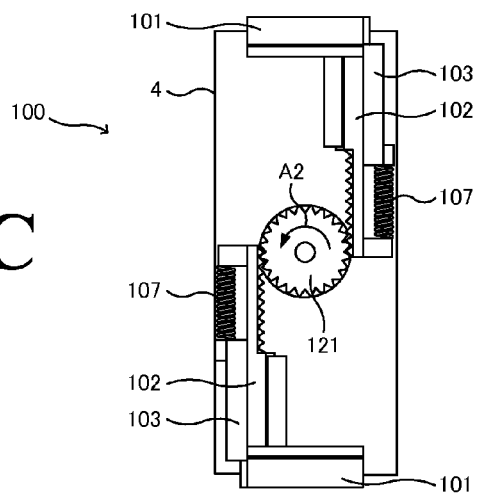

As shown in FIG. 3C, the slide plates 101 are operable over a wide area that exceeds the area of the inner surface of the openable and closable door 4. This is because the holding mechanism 100 is disposed at the openable and closable door 4, and opening the openable and closable door 4 causes the holding mechanism 100 to move to outside of the control apparatus 1, which eliminates any restrictions on the operation of the slide plates 101 associated with the housing shape of the control apparatus 1 or other factors. For example, assume that a holding mechanism of a similar structure is disposed in a depression of the housing dedicated to the port. In this case, the operable range of the slide plates is limited to the size of the depression. Compared with this configuration, this embodiment greatly enlarges the operable range of the slide plates 101, which is significantly advantageous. This, as a result, ensures holding of USB devices of a wide variety of sizes and shapes, and provides improved versatility.

Next, by referring to FIGS. 4 to 6, a brake function of the holding mechanism 100 will be described. When the slide plates 101 hold between them the housing 52 of the USB memory 50, the brake function stops the slide plates 101 at this holding position against the biasing force of the springs 107, which at any time bias the slide plates 101 to return to their respective reference positions, as described above. It is noted that in FIG. 5, the presser plate 109, the presser spring 110, and the gear member 121 are not shown for ease of description.

Figure 4:
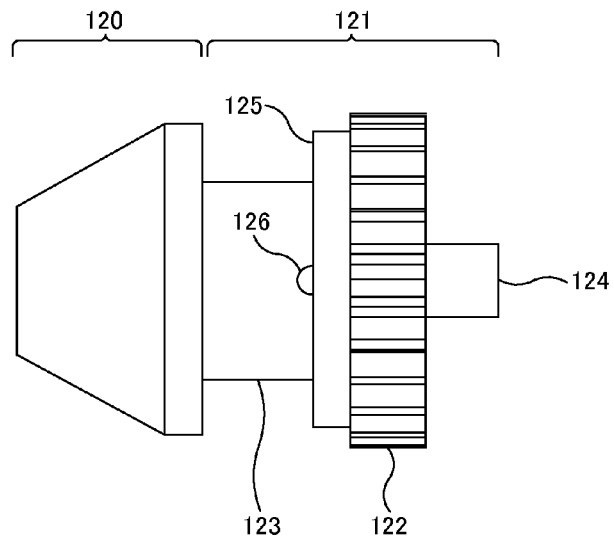
FIG. 4 is a side view of the regulation member and a gear member, illustrating their structures.
Figure 6:
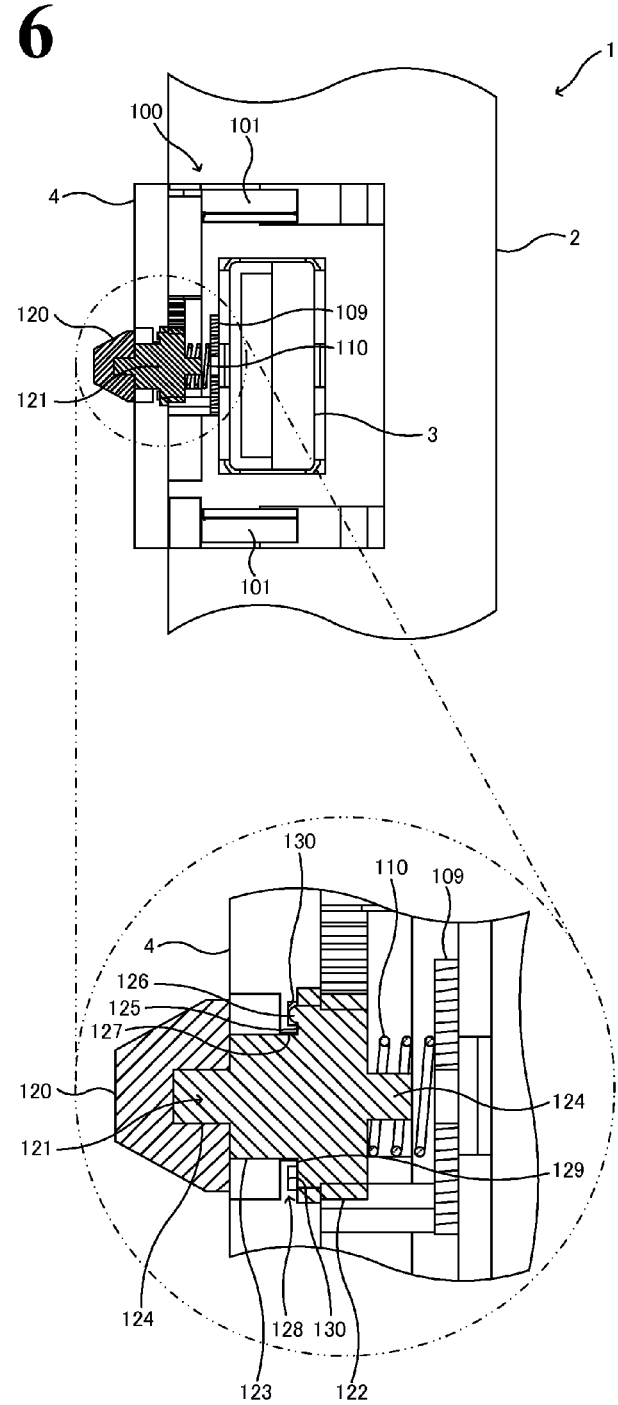
FIG. 6 is an enlarged front view, partially a cross-sectional view, of the port of the control apparatus with its openable and closable door in open state, illustrating a structure of a brake function.

As shown in FIGS. 4 and 6, the gear member 121 includes a gear 122, a trunk 123, and an axis 124. The gear 122 has, on its outer circumference, teeth to mesh with the rack gear 104. The trunk 123 couples the gear 122 and the regulation member 120 to one another while ensuring a predetermined distance therebetween. The gear 122 and the trunk 123 are coaxial to the axis 124. As shown in FIG. 6, the axis 124 of the gear member 121 is inserted into the regulation member 120, and thus the regulation member 120 and the gear member 121 are coupled to one another into an integral configuration. On an end surface 125 of the gear 122 on the side of the regulation member 120, a hemispheric protrusion 126 is formed. While in this embodiment the gear 122, the trunk 123, and the axis 124 of the gear member 121 are integrally formed as shown in FIG. 6, they may be formed as separate elements coupled to each other.

Figure 5:
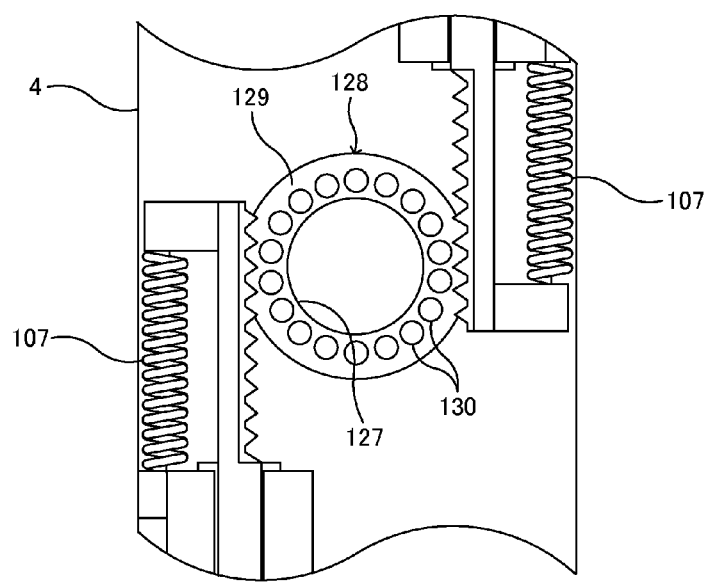
FIG. 5 illustrates an inner surface of the openable and closable door with its inner structure partially enlarged.

As shown in FIG. 5, the openable and closable door 4 includes a through hole 127 to penetrate through the trunk 123 of the gear member 121. The through hole 127 has an inner diameter approximately equal to the outer diameter of the trunk 123 of the gear member 121. The circumferential portion of the through hole 127 in the radial direction is thinner in thickness than the other portions of the openable and closable door 4. The thinner portion functions as a bearing 128 to slidably support the trunk 123 of the gear member 121 in such a manner that the trunk 123 can make rotational and linear motions. On an end surface 129 of the bearing 128 on the side of the door inner surface, a plurality of round holes 130 are formed. The round holes 130 are capable of engaging with the protrusion 126 of the gear member 121. The round holes 130 are arranged circumferentially at a predetermined pitch.

As shown in FIG. 6, the integrated regulation member 120 and gear member 121 are at any time biased by the presser spring 110 toward the outer surface of the openable and closable door 4 (the left side in FIG. 6). This brings the end surface 125 of the gear member 121 into contact with the end surface 129 of the bearing 128, thereby bringing the protrusion 126 into engagement with one of the round holes 130. The engagement of the protrusion 126 restricts the rotation of the gear member 121, and this in turn restricts the movement of the supports 102, which mesh with the gear 122 of the gear member 121 at the rack gears 104. In this manner, brake acts on the slide plates 101.

When the regulation member 120 is handled into rotation, the protrusion 126 of the gear member 121 moves over the end surface 129 while straddling the round holes 130. That is, the regulation member 120 is handled into rotation by a handling force greater than the friction force acting between the protrusion 126 and the round holes 130. In this respect, the pitch between the round holes 130 is set at a small level to prevent the protrusion 126 from becoming stuck between adjoin round holes 130. This ensures that when the regulation member 120 is in non-handled state, the protrusion 126 of the gear member 121 is engaged with any one of the round holes 130. As a result, while the regulation member 120 is in non-handled state, brake keeps acting on the slide plates 101 unless a release operation of the brake is performed, described later.

It is noted that because of the above-described configuration, the minimum movement of the slide plates 101 is equivalent to the pitch between the circumferentially formed round holes 130. This leaves a possibility of a dimensional error between the width of the housing 52 of the USB memory 50 and the distance between the slide plates 101 positioned at their respective holding positions (each of which is the position that, as a result of the slide plates 101 moving on a minimum movement basis, most suitably corresponds to the width of the housing 52 of the USB memory 50). In view of this, the elastic members 108 are disposed on the slide plates 101, as described above. The elastic members 108 are elastically deformed and make the dimensional error tolerable, and come into contact with the housing 52 at the slide plates 101, thereby reliably holding the housing 52 between the elastic members 108.

In the above-described configuration, the presser spring 110, the protrusion 126, the round holes 130, the gear 122, and the rack gear 104 are examples of the position fixing unit recited in the appended claims.

Next, by referring to FIGS. 7, 8A, and 8B, a brake release function of the holding mechanism 100 will be described. FIG. 8A illustrates a state in which brake is in action, while FIG. 8B illustrates a state in which brake is released.

Figure 7:
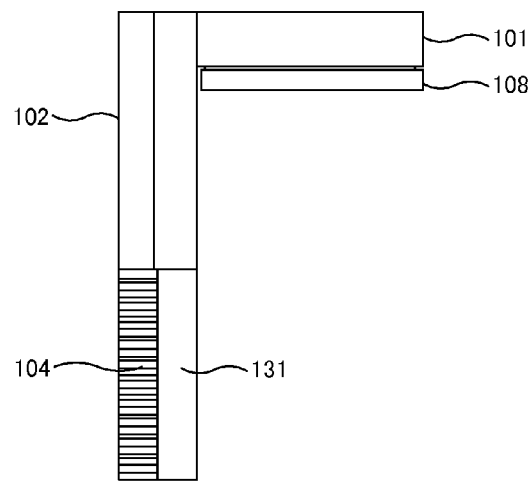
FIG. 7 is a side view of a slide plate and a support member extracted to illustrate their whole structures.
Figure 8A:
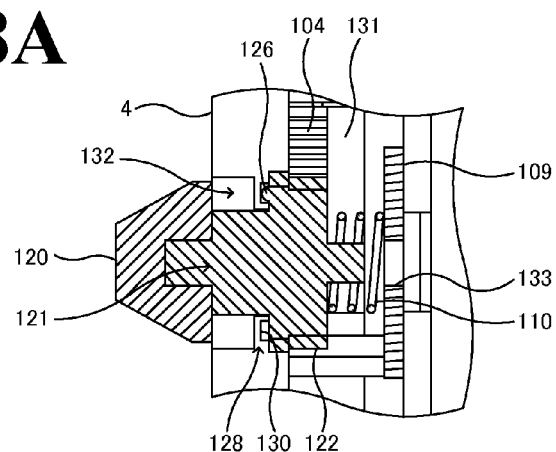
FIGS. 8A and 8B are each an enlarged side view, partially a cross-sectional view, of the regulation member at the openable and closable door, illustrating a structure of a brake release function.

As shown in FIG. 7, the rack gear 104 is disposed at the other side (the lower side in FIG. 7) of the support 102 opposite its one end (the upper end in FIG. 7) to which the slide plate 101 and the elastic member 108 are secured. The rack gear 104 is not disposed over the entire thickness of the support 102 (which is in the lateral direction in FIG. 7). Instead, the rack gear 104 is disposed over approximately half the thickness of the support 102. The other half is a toothless, flat portion 131.

As shown in FIG. 8A, in normal state, the presser spring 110 biases the gear member 121 toward the outer surface of the openable and closable door 4 (the left side in FIG. 8), keeping the protrusion 126 of the gear member 121 in engagement with one of the round holes 130 of the openable and closable door 4. The engagement of the protrusion 126 restricts the rotation of the gear member 121, and this in turn restricts the movement of the supports 102, which mesh with the gear 122 of the gear member 121 at the rack gears 104. In this manner, brake is acting on the slide plates 101.

Figure 8B:
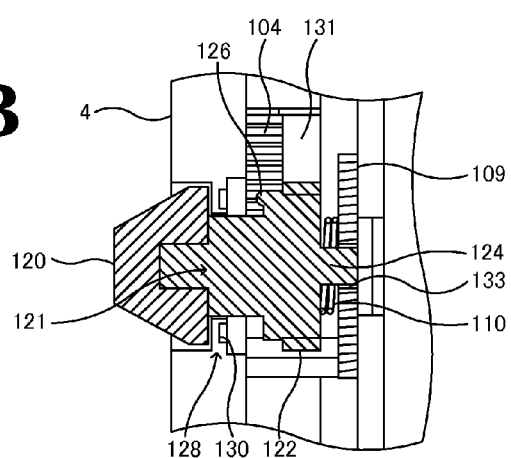

As shown in FIG. 8B, when the regulation member 120 is pushed into the inner surface of the openable and closable door 4 (the right side in FIG. 8), the gear 122 of the gear member 121 moves to the flat portion 131. This releases the mesh between the rack gear 104 and the gear 122, and the biasing force of the springs 107 moves the supports 102 to return the slide plates 101 to their reference positions. In this manner, the brake on the slide plates 101 is released.

Figure 10A:
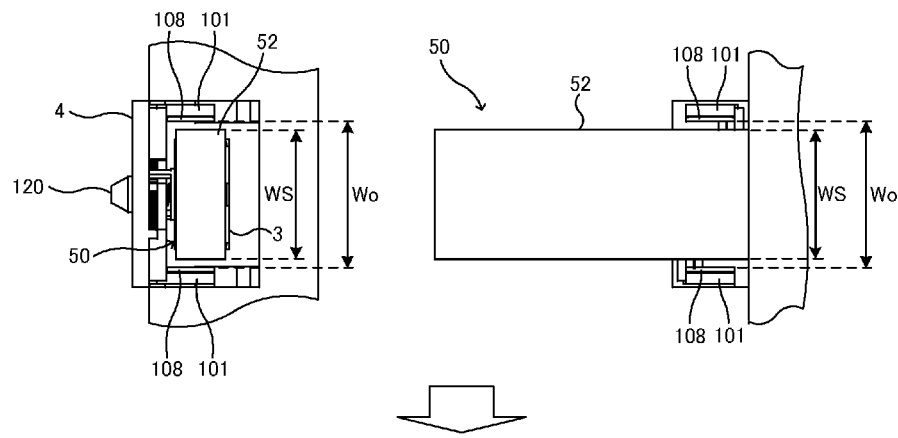
FIGS. 10A to 10C are diagrams each illustrating a method of operation in the case where the housing of a USB memory has a width smaller than a reference width of the slide plates.

This kind of brake release is done when, for example, the housing 52 of the USB memory 50 to be removed has a smaller width than the reference width of the slide plates 101 (see FIGS. 10A to 10C, described later). Instead of releasing the brake, it is also possible to remove such USB memory 50 by handling the regulation member 120 into clockwise rotation and thereby enlarging the distance between the slide plates 101.

It is noted that the openable and closable door 4 includes an accepting space 132 at the bearing 128 on the outer surface side of the door (the left side in FIGS. 8A and 8B). The accepting space 132 ensures pushing of the regulation member 120. At a center portion of the presser plate 109, an opening 133 is disposed to accept the axis 124 of the gear member 121 when the regulation member 120 is pushed inwardly.

In the above-described configuration, the regulation member 120, the accepting space 132, and the flat portion 131 are examples of the fixation releasing unit recited in the appended claims.

Figure 9A:
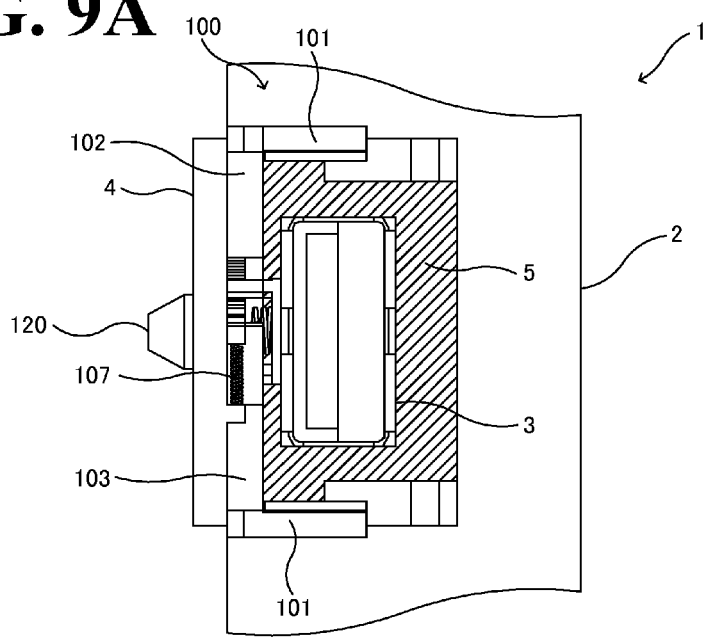
FIGS. 9A and 9B are diagrams each illustrating an area of plating.
Figure 9B:
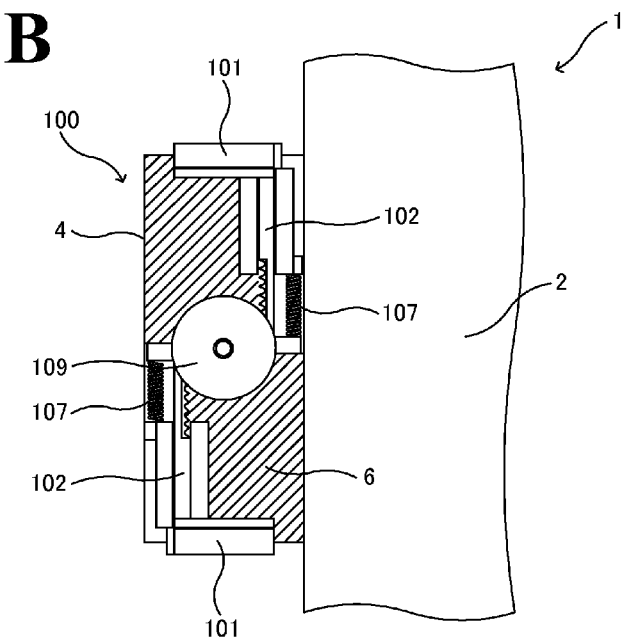

Next, by referring to FIGS. 9A and 9B, an area of plating will be described. In the control apparatus 1, there is a possibility of the port 3 becoming a source of emitting noise to outside the apparatus, or a possibility of the port 3 becoming a source of receiving noise resulting in malfunction. In view of this, this embodiment provides a plated portion 5, which is subjected to plating treatment, as if to surround the port 3 as shown in FIG. 9A (where the area of the plated portion 5 is shaded). This embodiment also provides a plated portion 6, which is subjected to plating treatment over approximately the entire inner surface of the openable and closable door 4 as shown in FIG. 9B (where the area of the plated portion 6 is shaded).

Examples of the plating material to be used include a conductive material such as copper and nickel. The plated portions 5 and 6 are both grounded to a frame ground (not shown) of the housing 2. It is noted that the holding mechanism 100 made up of the slide plates 101 and other elements is disposed on the plated portion 6 at the inner surface of the openable and closable door 4.

When the USB memory 50 is in connection state with the openable and closable door 4 open, the above-described noise emission and reception are eliminated or minimized mainly by the plated portion 5, which is formed around the port 3. When the USB memory 50 is removed and the openable and closable door 4 is in closed state, the above-described noise emission and reception are eliminated or minimized mainly by the plated portion 6, which is formed on the inner surface of the openable and closable door 4.

Next, by referring to FIGS. 10A to 10C and 11, a method of operation for connection and disconnection of the USB memory 50 will be described. It is noted that in this embodiment, the distance between the elastic members 108 when the slide plates 101 are positioned at the above-described reference positions will be referred to as a "reference width".

First, by referring to FIGS. 10A to 10C, description will be made with regard to the case where the width of the housing of the USB memory is smaller than the reference width of the slide plates. As shown in FIG. 10A, when the width, WS, of the housing 52 of the USB memory 50 is smaller than the reference width, Wo, of the slide plates 101, the operator opens the openable and closable door 4 and inserts the connector 51 of the USB memory 50 directly into the port 3, thus connecting the USB memory 50 to the control apparatus 1. This makes the USB memory 50 supported in the form of a cantilever with the housing 52 passed between the slide plates 101.

Figure 10B:
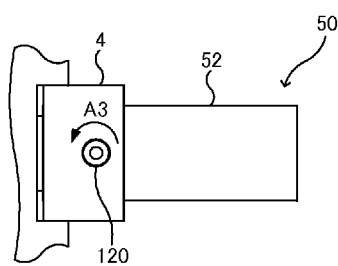

Next, as shown in FIG. 10B, the operator handles the regulation member 120 into rotation in the anti-clockwise direction as represented by the arrow A3 shown in FIG. 10B. As described above by referring to FIG. 3B, this brings the gear member 121 into rotation in the clockwise direction (with the openable and closable door 4 seen from inside). This in turn brings the supports 102 into sliding movement along the guides 103 against the compressive force of the springs 107. That is, the slide plates 101 move in directions in which the slide plates 101 come close to one another.

Figure 10C:
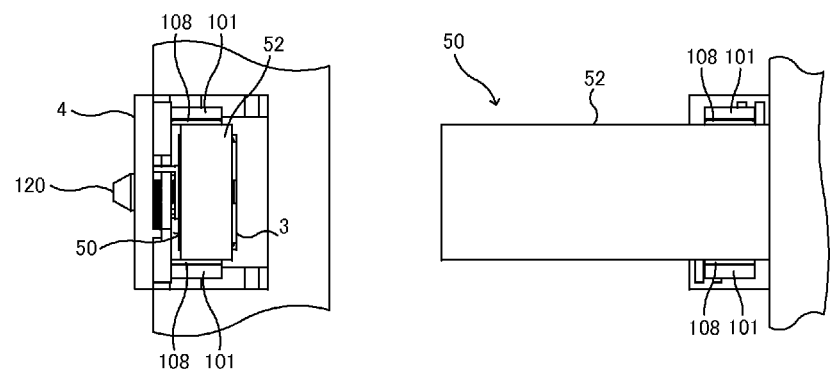

When the elastic members 108 move to positions at which to come into contact with the housing 52, the housing 52 of the USB memory 50 is held between the slide plates 101, as shown in FIG. 10C. Thus, the USB memory 50 is connected, and this connected state is maintained with high holding strength.

When the USB memory 50 is to be removed, the operator may handle the regulation member 120 into rotation in the clockwise direction, which is opposite the above-described direction, thereby separating the slide plates 101 from one another. More simply, it is possible to inwardly push the regulation member 120. This releases the brake on the slide plates 101 as described above, and the slide plates 101 automatically return to their respective reference positions. Then, the connector 51 of the USB memory 50 is pulled out of the port 3, and thus the USB memory 50 is removed from the control apparatus 1.

Figure 11A:
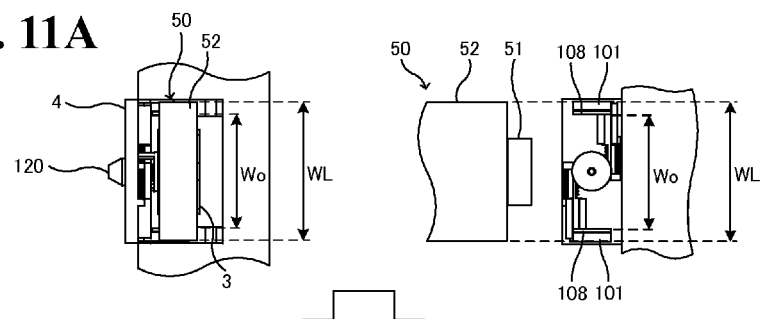
FIGS. 11A to 11E are diagrams each illustrating a method of operation in the case where the housing of the USB memory has a width greater than the reference width of the slide plates.

Next, by referring to FIGS. 11A to 11E, description will be made with regard to the case where the width of the housing of the USB memory is larger than the reference width of the slide plates. As shown in FIG. 11A, when the width, WL, of the housing 52 of the USB memory 50 is larger than the reference width Wo of the slide plates 101, the USB memory 50 cannot be directly connected to the control apparatus 1.

Figure 11B:
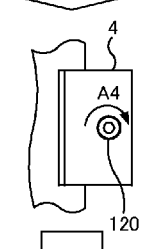

In view of this, as shown in FIG. 11B, with the openable and closable door 4 in open state, the operator handles the regulation member 120 into rotation in the clockwise direction as represented by the arrow A4. As described above by referring to FIG. 3C, this brings the gear member 121 into rotation in the anti-clockwise direction (with the openable and closable door 4 seen from inside). This in turn brings the supports 102 into sliding movement along the guides 103 against the stretching force of the springs 107. That is, the slide plates 101 move in directions in which the slide plates 101 come apart from one another.

Figure 11C:
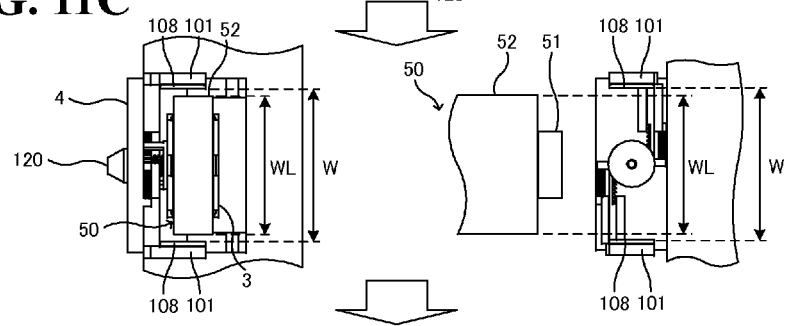

As shown in FIG. 11C, when the slide plates 101 move to positions at which the width W of the slide plates 101 (more precisely, the distance between the elastic members 108) is larger than the width WL of the housing 52, the operator inserts the connector 51 of the USB memory 50 into the port 3, thus connecting the USB memory 50 to the control apparatus 1. This makes the USB memory 50 supported in the form of a cantilever with the housing 52 passed between the slide plates 101.

Figure 11D:
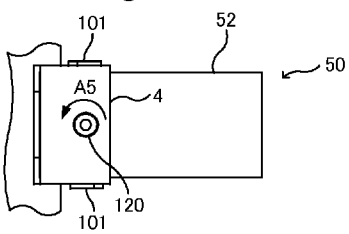

Next, as shown in FIG. 11D, the operator handles the regulation member 120 into rotation in the anti-clockwise direction as represented by the arrow A5. As described above by referring to FIG. 3B, this brings the gear member 121 into rotation in the clockwise direction (with the openable and closable door 4 seen from inside). This in turn brings the supports 102 into sliding movement along the guides 103 against the compressive force of the springs 107. That is, the slide plates 101 move in directions in which the slide plates 101 come close to one another.

Figure 11E:
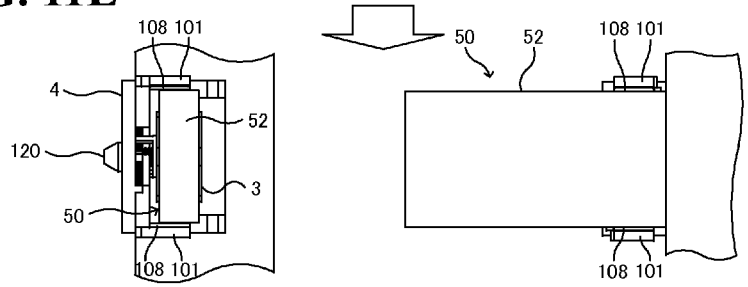

When the elastic members 108 move to positions at which to come into contact with the housing 52, the housing 52 of the USB memory 50 is held between the slide plates 101 as shown in FIG. 11E. Thus, the USB memory 50 is connected, and this connected state is maintained with high holding strength.

When the USB memory 50 is to be removed, the operator handles the regulation member 120 into rotation in the clockwise direction, which is opposite the above-described direction, thereby separating the slide plates 101 from one another. Then, the connector 51 of the USB memory 50 is pulled out of the port 3, and thus the USB memory 50 is removed from the control apparatus 1. It is noted that in this state the slide plates 101 protrude beyond the openable and closable door 4 as shown in FIG. 11C, making it impossible to close the openable and closable door 4. However, inwardly pushing the regulation member 120 makes the slide plates 101 automatically return to their respective reference positions, after which the openable and closable door 4 can be closed.

With the above-described control apparatus 1 according to this embodiment, inserting the connector 51 of the USB memory 50 into the port 3 connects the USB memory 50 to the control apparatus 1, while pulling the connector 51 out of the port 3 removes the USB memory 50 from the control apparatus 1. Adjacent the port 3 of the control apparatus 1, the openable and closable door 4 is disposed. During the period of disconnection time of the USB memory 50, the openable and closable door 4 is closed to shield the port 3, while during the period of connection time of the USB memory 50, the openable and closable door 4 is open to expose the port 3.

At the openable and closable door 4, the holding mechanism 100 is disposed. The holding mechanism 100 holds the housing 52 of the connected USB memory 50, and this eliminates or minimizes pulling of the connector 51 of the USB memory 50 out of the port 3 and maintains the connection state of the USB memory 50 with high holding strength. Since the holding mechanism 100 is disposed at the openable and closable door 4, when the openable and closable door 4 opens, the holding mechanism 100 moves to outside of the housing 2 of the control apparatus 1. This ensures a structure that eliminates any restrictions on the holding operation of the holding mechanism 100 associated with the housing shape of the control apparatus 1 or other factors. This ensures holding of the housing 52 of the USB memory 50 even when it comes in a wide variety of sizes and shapes, and provides improved versatility. Additionally, during the period of disconnection time of the USB memory 50, the openable and closable door 4 is closed to shield the port 3. This eliminates or minimizes electrical short-circuit of the port 3 and attachment, to the port 3, of dust and other substances that can cause communication disturbance or other occurrences.

It is particularly noted that in this embodiment, the holding mechanism 100 includes, at the inner surface of the openable and closable door 4, the two slide plates 101 to hold the housing 52 of the USB memory 50 between the slide plates 101. The slide plates 101 are movable in directions in which the slide plates 101, which are disposed on one side and the other side of the openable and closable door 4, come close to and apart from one another. This ensures that when the housing 52 of the USB memory 50 to be connected has a large width, the slide plates 101 move apart from one another to enlarge the distance between the slide plates 101, which permits the slide plates 101 to hold such housing 52 between the slide plates 101. When the housing 52 of the USB memory 50 to be connected has a small width, the slide plates 101 move close to one another to diminish the distance between the slide plates 101, which permits the slide plates 101 to hold such housing 52 between the slide plates 101. In this manner, the housing 52 of the USB memory 50 is held even when it comes in a wide variety of sizes and shapes, which provides improved versatility. Additionally, the slide plates 101 are disposed at the inner surface of the openable and closable door 4. This ensures that closing the openable and closable door 4 during the period of disconnection time of the USB memory 50 eliminates or minimizes exposure of the slide plates 101 to the outside. This in turn eliminates or minimizes a disfigured external appearance of the control apparatus 1.

It is particularly noted that in this embodiment, the holding mechanism 100 includes, at the outer surface of the openable and closable door 4, the regulation member 120 to regulate movement of the slide plates 101 in directions in which the slide plates 101 come close to and apart from one another. With the use of the regulation member 120, the operator can easily move the slide plates 101. This improves operability associated with connection and disconnection of the USB memory 50.

It is particularly noted that in this embodiment, the distance between the slide plates 101 is adjusted while the slide plates 101 are moving in directions in which they come close to or apart from one another. Then at holding positions corresponding to the size of the housing 52 of the USB memory 50, the slide plates 101 hold the housing 52 between the slide plates 101 so as to support the housing 52. In this respect, the brake function implemented by the engagement of the protrusion 126 of the gear member 121 with one of the round holes 130 of the openable and closable door 4 fixes the positions of the slide plates 101 at their respective holding positions. This eliminates or minimizes displacement of the slide plates 101 off the holding positions due to, for example, vibration, shock, and other kinds of impact, resulting in improved holding function of the USB memory 50. Even though the slide plates 101 are at any time biased by the springs 107 to return to the reference positions, the brake function keeps the slide plates 101 at the holding positions.

It is particularly noted that in this embodiment, by the operator inwardly pushing the regulation member 120, the mesh of the rack gears 104 of the supports 102 with the gear 122 of the gear member 121 is released, and thus the brake on the slide plates 101 is released. When the brake is released, the slide plates 101 are returned to their respective reference positions by the biasing force of the springs 107. This ensures that when the openable and closable door 4 is closed after the USB memory 50 has been removed, the moved slide plates 101 are easily and quickly returned to their respective reference positions. This greatly saves labor associated with returning the slide plates 101 to their respective reference positions during the time when the openable and closable door 4 is closed.

It is particularly noted that in this embodiment, the slide plates 101 each include the elastic member 108 at the portion of contact with the housing 52 of the USB memory 50. This eliminates or minimizes slipping between the slide plates 101 and the housing 52, and the holding function for the USB memory 50 further improves. Even if the housing 52 of the USB memory 50 has a shape that is, for example, inclined relative to the slide plates 101 or has depressions and protrusions, the elastic members 108 can be elastically deformed to reliably hold the housing 52 between the elastic members 108. Thus, the elastic members 108 are capable of holding between them the housing 52 of the USB memory 50 even if it comes in a wide variety of shapes, providing improved versatility. Further in this embodiment, the slide plates 101 move stepwise on the basis of the pitch between the round holes 130. Hence, disagreement can arise between the width of the housing of the USB memory 50 and the distance between the slide plates 101 at their respective holding positions. In this case, the elastic members 108, which are disposed on the slide plates 101, are elastically deformed upon contact with the housing 52 and make the dimensional error tolerable. Thus, the elastic members 108 reliably hold the housing 52 between the elastic members 108.

It is particularly noted that in this embodiment, the inner surface of the openable and closable door 4 is plated with a conductive material. This eliminates or minimizes malfunction of the control apparatus 1 caused by, when the openable and closable door 4 is in closed state during the period of disconnection time of the USB memory 50, the port 3 becoming a source of emitting noise to outside the control apparatus 1 or becoming a source of receiving noise. Also, a certain area around the port 3 is plated, and this eliminates or minimizes the above-described noise emission and reception also when the USB memory 50 is in connection state with the openable and closable door 4 open.

Second Embodiment

Next, by referring to FIGS. 12A to 17, a second embodiment will be described. The second embodiment is similar to the first embodiment described above in maintaining the connected state of the housing 52 of the connected USB memory 50 with high holding strength by holding the housing 52. The second embodiment is different from the first embodiment in the configuration of the holding mechanism.

Figure 12A:
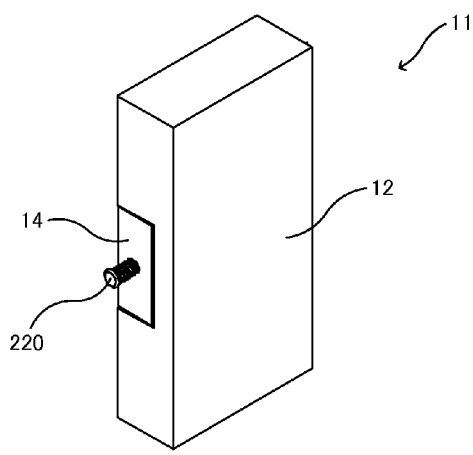
FIGS. 12A to 12C are each a perspective view of the control apparatus according to a second embodiment, illustrating an external appearance of the control apparatus.
Figure 12B:
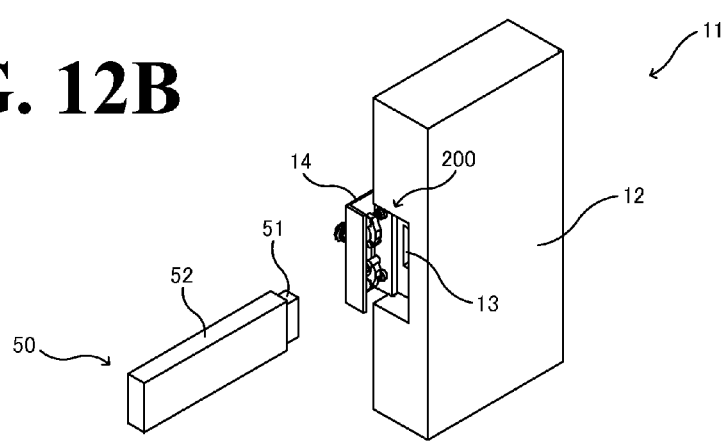
Figure 12C:
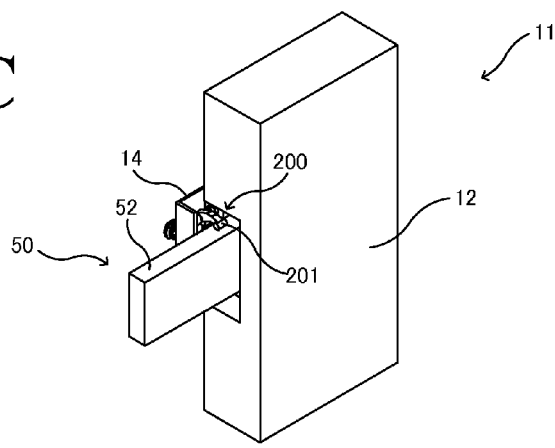

First, by referring to FIGS. 12A to 12C, the external appearance of the control apparatus according to the second embodiment will be described. As shown in FIGS. 12A to 12C, a port 13 is disposed on one surface of a housing 12 of a control apparatus 11 (on the left lower side as seen in FIGS. 12A to 12C). The port 13 accepts the connector 51 of the USB memory 50. In the following description, the side on which the port 13 is disposed will be referred to as the front side of the control apparatus 11. Adjacent the front side of the port 13, an openable and closable door 14 is disposed in an openable and closable manner with one side having a hinge structure. When the openable and closable door 14 is open, the openable and closable door 14 exposes the port 13 as shown in FIG. 12B, while when closed, the openable and closable door 14 shields the port 13 as shown in FIG. 12A. As shown in FIG. 12C, the openable and closable door 14 includes a holding mechanism 200 to hold the housing 52 of the USB memory 50 when the openable and closable door 14 is open. As shown in FIG. 12A, the holding mechanism 200 includes a push button 220 to regulate movement of holding members 201 on the outer surface of the openable and closable door 14.

Figure 13A:
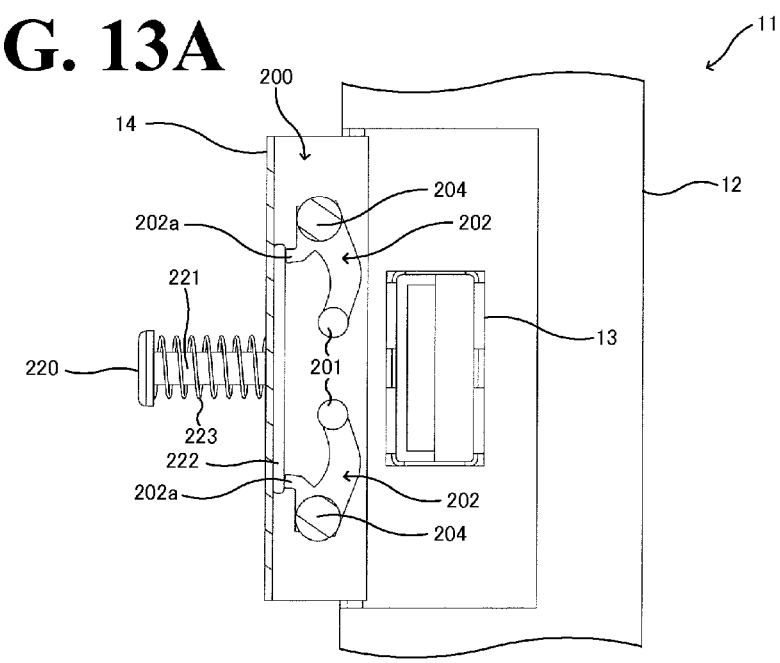
FIG. 13A is a cross-sectional view of the holding mechanism taken along the line XIIIA-XIIIA shown in FIG. 13B, illustrating in detail a structure of the holding mechanism, and 13B is a side view of the holding mechanism with the housing partially shown in a cross-sectional view.
Figure 13B:
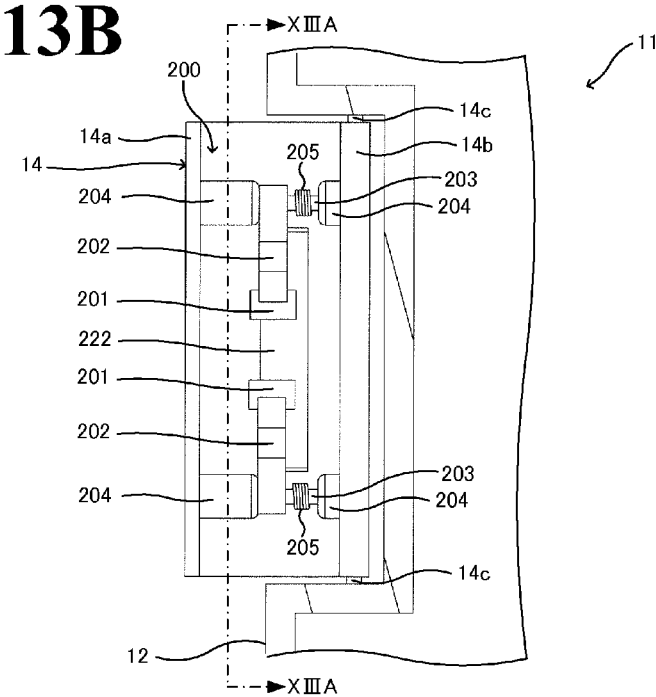

Next, by referring to FIGS. 13A to 15, a structure of the holding mechanism 200 will be described in detail. As shown in FIGS. 13A and 13B, the holding mechanism 200 includes two holding members 201 to hold the housing 52 of the USB memory 50 on both sides of the housing 52 so as to support the housing 52. The two holding members 201 are disposed at one side and the other side (upper side and lower side in this example) of the inner surface of the openable and closable door 14. The holding members 201 are movable in directions in which the holding members 201 come close to and apart from one another (in the vertical directions in FIG. 15).

Figure 14A:
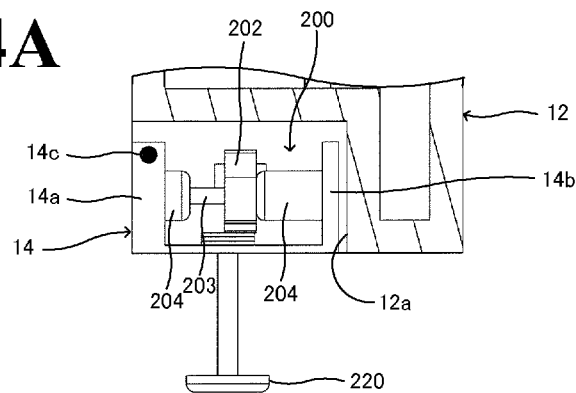
FIGS. 14A to 14C are diagrams each illustrating an open-close operation of the openable and closable door.
Figure 14B:
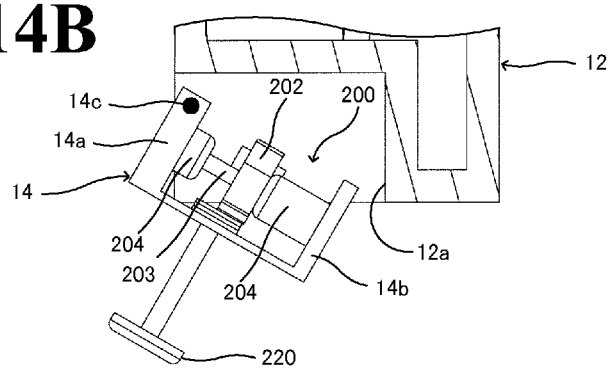
Figure 14C:
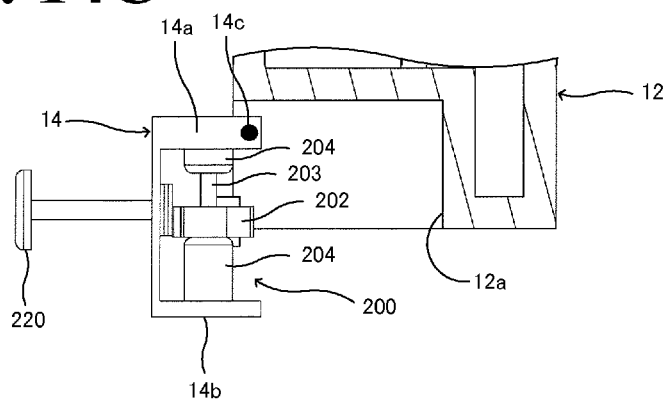

Specifically, each of the holding members 201 is disposed at the distal end of a corresponding one of arm members 202. Each of the arm members 202 is curved in an approximately dogleg shape so as to avoid contact with the corners of the housing 52 when the holding members 201 hold the housing 52 of the USB memory 50 between the holding members 201. Each of the arm members 202 is rotatable about a corresponding one of axes 203 disposed at the upper side and the lower side of the inner surface of the openable and closable door 14. Each of the axes 203 is disposed at the openable and closable door 14 through axis supports 204 each having a larger diameter than the diameter of the corresponding axis 203. In this embodiment, as shown in FIGS. 14A to 14C, the openable and closable door 14 includes side walls 14a and 14b defining an approximate U-shape in plan view. Each of the axes 203 has its both ends supported by the side walls 14a and 14b through the axis supports 204.

As shown in FIG. 13B, each of the axes 203 includes a torsion coil spring 205 having one end secured to the corresponding arm member 202 and another end secured to the corresponding axis 203. The torsion coil spring 205 at any time biases the arm member 202 into rotation in a direction in which the holding members 201 come close to one another (in the arrow X direction in FIG. 15). When the push button 220 is in non-pushed state, the biasing force of the coil springs 205 keeps the arm members 202 and the holding members 201 within the openable and closable door 14 (within the space between the side walls 14a and 14b) as shown in FIGS. 13A and 13B and FIGS. 14A to 14C. The torsion coil spring 205 is an example of the second biasing unit recited in the appended claims. In FIGS. 14A to 14C, the torsion coil spring 205 is not shown.

FIGS. 14A to 14C each illustrate an open-close operation of the openable and closable door 14. The openable and closable door 14 is rotatable relative to the housing 12 about an axis 14c, which is a rotation axis disposed on the rear side of the side wall 14a (on the upper side in FIGS. 14A to 14C). As shown in FIG. 14A, when the openable and closable door 14 is in closed state, the openable and closable door 14 as a whole, including the side walls 14a and 14b, is accommodated within a depression 12a of the housing 12 together with the holding mechanism 200. The openable and closable door 14 can be turned into rotation as shown in FIG. 14B. When the openable and closable door 14 is rotated approximately 90 degrees about the axis 14c as shown in FIG. 14C, the openable and closable door 14 is in open state and the port 13 is exposed. As shown in FIG. 14C, during the time when the openable and closable door 14 is open, the side wall 14b functions as a cover over the front side of the holding mechanism 200. This provides protection for the holding mechanism 200, eliminating or minimizing contact of the USB memory 50 and the operator's fingers with the holding mechanism 200. This also eliminates or minimizes a disfigured external appearance of the control apparatus 11 when the door is open.

Figure 15:
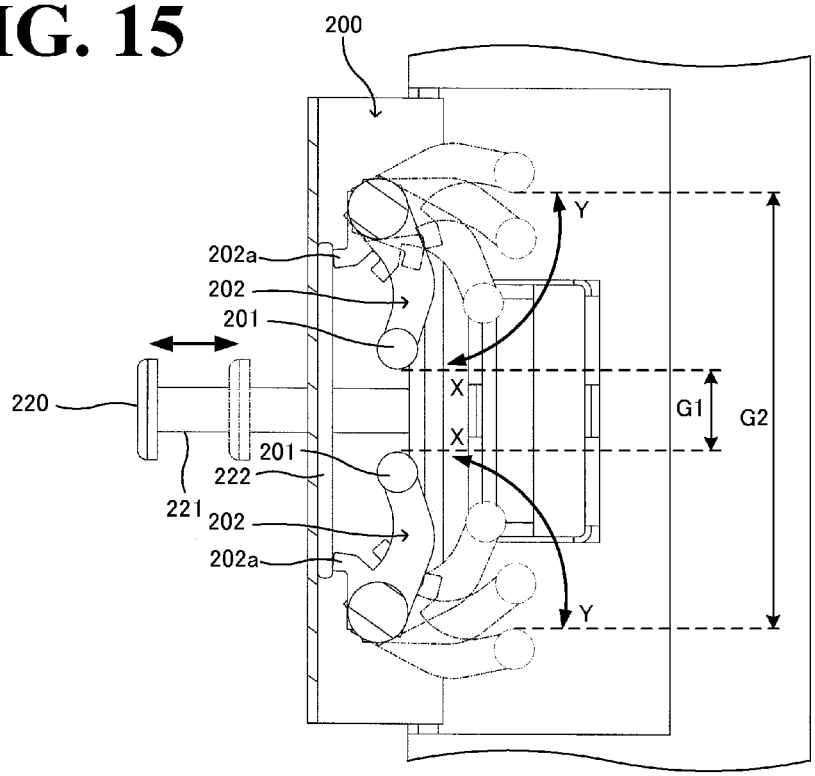
FIG. 15 is a cross-sectional view of the holding mechanism, illustrating a rotating operation of arm members implemented by handling of a push button.

As shown in FIG. 13A, the push button 220 is disposed outside the openable and closable door 14 and coupled to a rectangular pushing plate 222 through an axis 221, which penetrates through the openable and closable door 14. The pushing plate 222 is disposed on the inner side of the openable and closable door 14. The ends of the pushing plate 222 in its longitudinal direction are in contact with respective protrusions 202a of the arm members 202, which are disposed at the upper side and the lower side of the openable and closable door 14. As shown in FIG. 15, when the push button 220 is pushed inwardly toward the openable and closable door 14, the axis 221 and the pushing plate 222 are brought into movement to push the protrusions 202*a*. The arm members 202 are then brought into rotation in a direction in which the holding members 201 come apart from one another (in the arrow Y direction in FIG. 15) against the biasing force of the torsion coil springs 205.

As shown in FIG. 13A, the axis 221 includes a coil spring 223 to at any time bias the push button 220 toward the side opposite the openable and closable door 14. When the push button 220 is released, the biasing force of the coil spring 223 returns the push button 220, the axis 221, and the pushing plate 222 to their respective pre-pushing positions. As a result, as shown in FIG. 15, the biasing force of the torsion coil springs 205 brings the arm members 202 into rotation in a direction in which the holding members 201 come close to one another (in the arrow X direction in FIG. 15). The push button 220 is an example of the regulation member recited in the appended claims. In FIGS. 14A to 14C and 15, the coil spring 223 is not shown.

With the configuration of the holding mechanism 200 described above, handling (pushing and releasing) the push button 220 brings the arm members 202 into rotation in the Y direction and the X direction as shown in FIG. 15. Here, the holding members 201 move in directions in which the holding members 201 come close to and apart from one another while ensuring that the distance between the holding members 201 is in the range of G1 to G2.

Each of the holding members 201 has an approximately cylindrical shape. The entire body of each holding member 201 is made of an elastic material such as rubber and elastomer. The holding members 201 have their outer circumference surfaces of the cylindrical shapes come into contact with the housing 52 of the USB memory 50. This ensures that the holding members 201 uniformly contact the housing 52 even if the holding members 201 change their angles by the rotation of the arm members 202. Additionally, employing an elastic material for the entire body of each holding member 201 ensures that the housing 52 makes contact with the elastic material no matter where on the outer circumference surface of the holding member 201. This eliminates or minimizes slipping between the holding members 201 and the housing 52. Even if the housing 52 has a shape that is, for example, inclined relative to the holding members 201 or has depressions and protrusions, the holding members 201 can be elastically deformed to reliably hold the housing between the holding members 201. Thus, the holding members 201 are capable of holding between them USB devices of a wide variety of shapes, providing improved versatility.

It is also possible to employ an elastic material on a part of each holding member 201 (for example, only on the outer circumference surface), instead of the entire body of holding member 201.

In the control apparatus 11 according to this embodiment, similarly to the first embodiment described above, a certain area around the port 13 is plated, and approximately the entire inner surface of the openable and closable door 14 is plated. This will not be elaborated here.

Figure 16A:
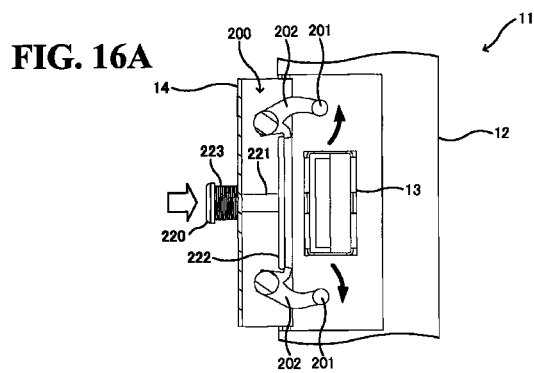
FIGS. 16A to 16C are diagrams each illustrating a method of operation for connection and disconnection of the USB memory.

Next, by referring to FIGS. 16A to 16C, a method of operation for connection and disconnection of the USB memory 50 will be described.

As described above, when the push button 220 is in non-pushed state, the arm members 202 and the holding members 201 are accommodated within the openable and closable door 14 (which is the state shown in FIG. 13A). In this state, when the operator pushes the push button 220 inwardly toward the openable and closable door 14 as shown in FIG. 16A, the arm members 202 are brought into rotation to move the holding members 201 in directions in which the holding members 201 come apart from one another. In this respect, the push button 220 is pushed inwardly such that the distance between the holding members 201 is greater than the housing 52 of the USB memory 50.

Figure 16B:
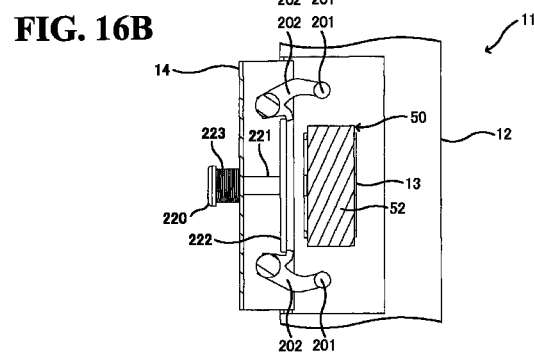

Next, as shown in FIG. 16B, the operator inserts the connector 51 of the USB memory 50 into the port 13, thus connecting the USB memory 50 to the control apparatus 11. This makes the USB memory 50 supported in the form of a cantilever with the housing 52 passed between the holding members 201.

Figure 16C:
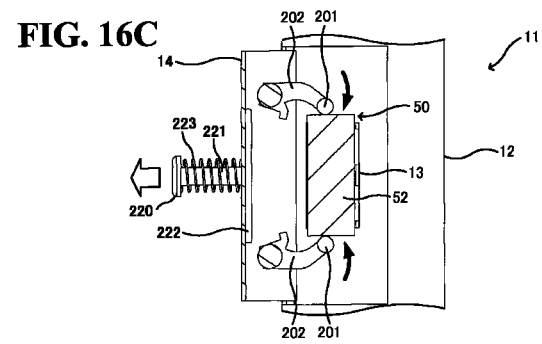

Next, as shown in FIG. 16C, when the operator releases the push button 220, the coil spring 223 returns the push button 220, the axis 221, and the pushing plate 222 to their respective pre-pushing positions, and the torsion coil springs 205 bring the respective arm members 202 into rotation in directions in which the holding members 201 come close to one another. This ensures that when the holding members 201 come in contact with the housing 52 of the USB memory 50, the housing 52 is held between the holding members 201. Thus, the USB memory 50 is connected, and this connected state is maintained with high holding strength.

When the USB memory 50 is to be removed, the above-described procedure may be applied in reverse. Specifically, the operator pushes again the push button 220 inwardly so as to move the holding members 201 apart from one another. Then, the connector 51 of the USB memory 50 is pulled out of the port 3, and thus the USB memory 50 is removed from the control apparatus 11.

In the control apparatus 11 according to this embodiment described hereinbefore, similarly to the first embodiment described above, the holding mechanism 200 holds the housing 52 of the connected USB memory 50. This eliminates or minimizes removal of the connector 51 of the USB memory 50 from the port 3, and maintains the connection state of the USB memory 50 with high holding strength. Additionally, the holding mechanism 200 has no gear structures or similar structures. This ensures a simplified structure with reduced piece-part count. Further, the operator only has to push the push button 220, which significantly facilitates the connecting and disconnecting operation of the USB memory 50.

Figure 17:
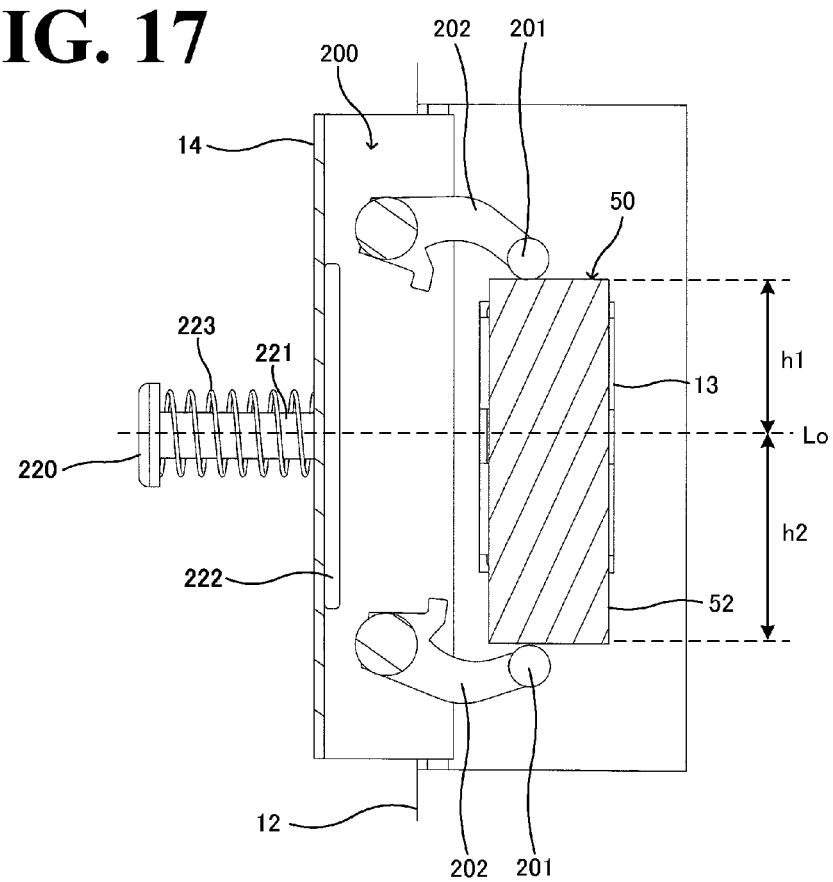
FIG. 17 is a cross-sectional view of the holding mechanism, illustrating a state in which the holding mechanism is holding a vertically asymmetrical USB memory.

Further, because of the structure of rotating the arm members 202 by the biasing force of the respective, separate torsion coil springs 205, the arm members 202 rotate independently of one another. As a result, as shown in FIG. 17, even when the housing 52 of the USB memory 50 has different vertical dimensions h1 and h2, which are based on a center line Lo of the connector 51 of the USB memory 50 (the center line of the port 3), the holding members 201 are capable of holding such housing 52 between the holding members 201. Thus, the holding members 201 are capable of holding between them a vertically asymmetrical USB device, providing further improved versatility.

Modifications

It will be appreciated that the first and second embodiments should not be construed in a limiting sense. Numerous modifications and variations are possible in light of the above teachings.

Figure 18:
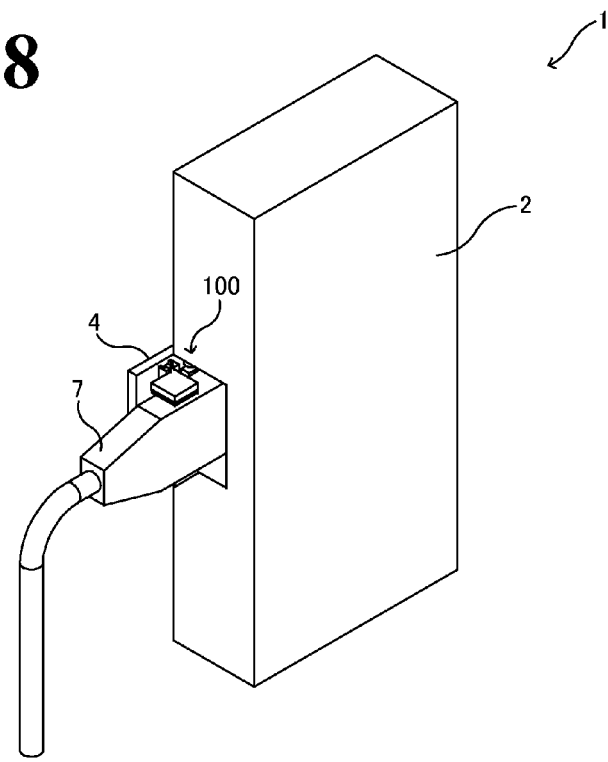
FIG. 18 is a perspective view of the control apparatus according to the first embodiment, illustrating an external appearance of the control apparatus with the USB cable connected thereto.
Figure 19:
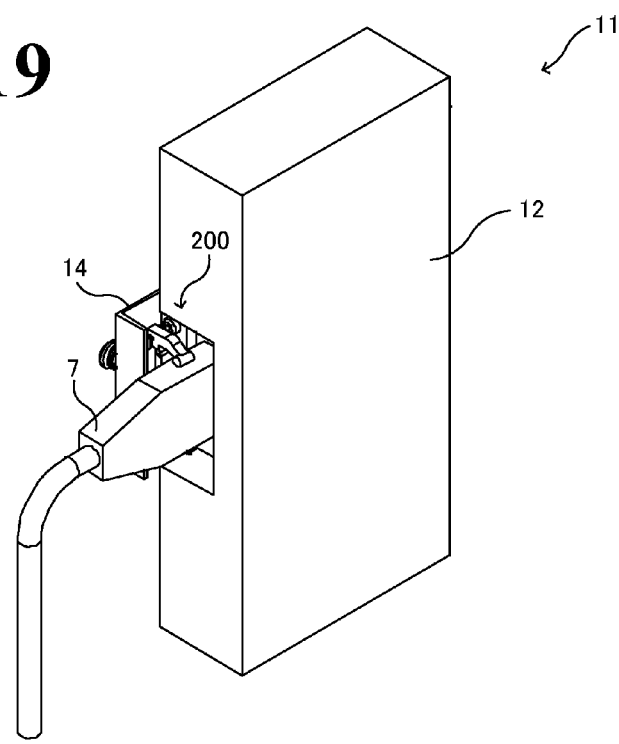
FIG. 19 is a perspective view of the control apparatus according to the second embodiment, illustrating an external appearance of the control apparatus with the USB cable connected thereto.

For example, while in the above-described embodiments a USB memory has been illustrated as an example of the USB device to be connected and disconnected, other kinds of USB devices may be employed. Examples include: external memory storages such as a hard disc drive; input devices such as a keyboard and a mouse; communication devices such as a hub; other devices to be connected by cable through USB; communication devices of wireless LAN (Local Area Network); interfaces for wireless mice; and other devices without cables. Thus, a wide variety of USB devices can be connected. FIGS. 18 and 19 are perspective views respectively of the control apparatuses 1 and 11 with a USB cable 7 connected thereto.

While in the above-described embodiments the control apparatus 1 has been illustrated as being an FA machine such as a PLC, this should not be construed in a limiting sense. The control apparatus may also be an Office Automation (OA) machine such as a personal computer. Furthermore, the control apparatus may not necessarily be such a control apparatus that controls some control object. Any other machines are possible insofar as the above-described USB devices are connectable.

Also in the above-described embodiments, the openable and closable doors 4 and 14 are opened in the lateral direction of the apparatus, and the housing 52 of the USB memory 50 is held from the vertical direction. This, however, should not be construed in a limiting sense. For example, the openable and closable door may be opened in the vertical direction of the apparatus, and the housing 52 may be held from the lateral direction.

Also in the above-described embodiments, the operator regulates the movement of the slide plates 101 or the holding members 201 manually by using the regulation member 120 or the push button 220. This, however, should not be construed in a limiting sense. It is also possible to automatically regulate the slide plates 101 or the holding members 201 by using a motor.

Also in the second embodiment described above, the push button 220 has been illustrated as an example of the regulation member such that by pushing the push button 220, the arm members 202 rotate in expanding directions (in directions in which the holding members 201 come apart from one another). This, however, should not be construed in a limiting sense. The regulation member may also be a pull button, in which case the arm members 202 rotate in expanding directions by pulling the button. Here, when the operator discontinues pulling of the button, the button may be forced back in place by spring force, and the arm members 202 and the holding members 201 may be accommodated within the openable and closable door 14.

Figure 20A:
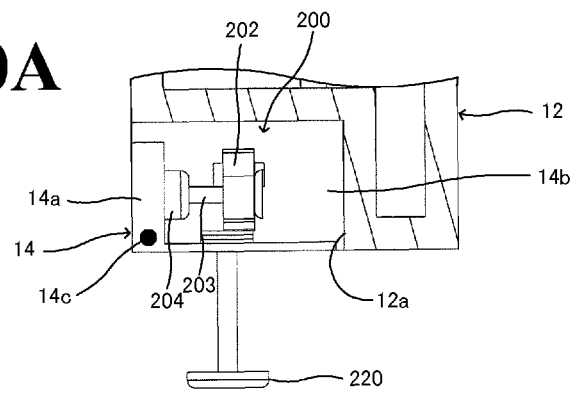
FIGS. 20A to 20C are diagrams each illustrating an open-close operation of an approximate L-shaped openable and closable door.
Figure 20B:
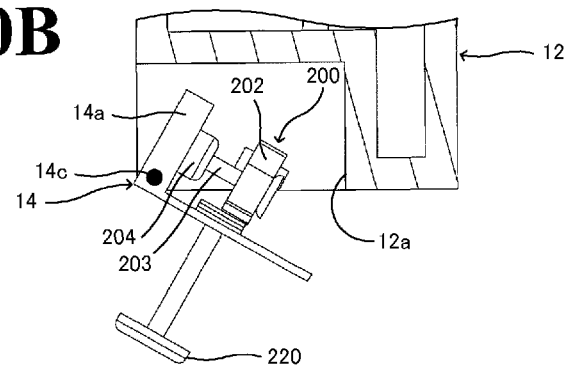
Figure 20C:
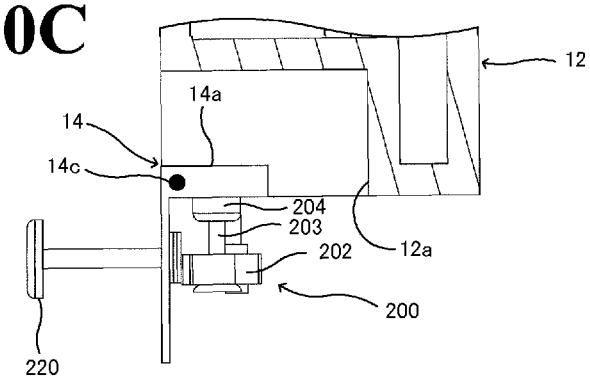

Also in the second embodiment described above, the openable and closable door 14 has been illustrated as having an approximate U-shape having the side walls 14a and 14b. The openable and closable door 14 may also have, for example, an approximate L-shape (a structure without the side wall 14b), supporting only one end of each of the axes 203 in the form of a cantilever, as shown in FIGS. 20A to 20C. In this case, the axis 14c is disposed at the front side of the side wall 14a (the lower side in FIGS. 20A to 20C). This provides an effect of eliminating or minimizing protrusion of the openable and closable door 14 to a lateral side of the housing 12 (the left side in FIGS. 20A to 20C) when the openable and closable door 14 is opened, as shown in FIGS. 20A to 20C. If the openable and closable door 14 has an approximate U-shape and its axis 14c is disposed at the front side of the side wall 14a, it is necessary to enlarge the depression 12a so as to avoid interference between the side wall 14b and the inner wall of the depression 12a when the door is opened and closed. This causes an increase in size of the housing 12. In view of this, in this modification, the openable and closable door 14 has an approximate L-shape and its axis 14c is disposed at the front side of the side wall 14a. This eliminates or minimizes projection of the openable and closable door 14 without causing an increase in size of the housing 12.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A control apparatus comprising:
   a port into which a connector of a USB device is insertable and from which the connector of the USB device is removable so as to connect and disconnect the USB device to and from the control apparatus;
   an openable and closable door disposed adjacent the port, the openable and closable door being configured to open so as to expose the port and configured to close so as to shield the port; and
   a holding mechanism disposed at the openable and closable door and configured to hold a housing of the USB device when the openable and closable door is open,
   wherein the holding mechanism comprises a regulation member at an outer surface of the openable and closable door, the regulation member configured to regulate movement of the holding mechanism.

2. The control apparatus according to claim 1,
   wherein the holding mechanism comprises at least two holding members behind an inner surface of the openable and closable door, the at least two holding members being configured to hold the housing of the USB device between the at least two holding members so as to support the housing of the USB device, and
   wherein the holding members are movable in directions in which one holding member among the holding members disposed at one side of the inner surface of the openable and closable door and another holding member among the holding members disposed at another side of the inner surface of the openable and closable door come close to and apart from one another.

3. The control apparatus according to claim 2, wherein the regulation member is configured to regulate movement of the holding mechanism by regulating the holding members to move in the directions in which the holding members come close to and apart from one another.

4. The control apparatus according to claim 2, wherein the holding mechanism comprises a position fixing unit configured to fix the holding members at respective holding positions corresponding to a size of the housing of the USB device.

5. A control apparatus comprising:
   a port into which a connector of a USB device is insertable and from which the connector of the USB device is removable so as to connect and disconnect the USB device to and from the control apparatus;
   an openable and closable door disposed adjacent the port, the openable and closable door being configured to open so as to expose the port and configured to close so as to shield the port; and
   a holding mechanism disposed at the openable and closable door and configured to hold a housing of the USB device when the openable and closable door is open,
   wherein the holding mechanism comprises at least two holding members behind an inner surface of the openable and closable door, the at least two holding members being configured to hold the housing of the USB device between the at least two holding members so as to support the housing of the USB device, wherein the holding members are movable in directions in which one holding member among the holding members disposed at one side of the inner surface of the openable and closable door and another holding member among the holding members disposed at another side of the inner surface of the openable and closable door come close to and apart from one another, wherein the holding mechanism comprises a position fixing unit configured to fix the holding members at respective holding positions corresponding to a size of the housing of the USB device, and wherein the holding mechanism comprises
a first biasing unit configured to bias the holding members back to predetermined reference positions at which the openable and closable door is closable, and
a fixation releasing unit configured to release the holding members fixed by the position fixing unit so as to permit the holding members to return to the respective reference positions by biasing force of the first biasing unit.

6. The control apparatus according to claim 2, wherein the holding members each comprise an elastic member at a portion of contact with the housing of the USB device.

7. The control apparatus according to claim 3, wherein the holding mechanism comprises at least two arm members each being rotatable about a corresponding one of axes disposed at the openable and closable door, wherein the holding members are each disposed at a distal end of a corresponding one of the at least two arm members, the holding members being movable in directions in which the holding members come close to and apart from one another by rotation of the at least two arm members.

8. The control apparatus according to claim 7, wherein the holding mechanism comprises a second biasing unit disposed at the axis and configured to rotate the arm members in directions in which the holding members come close to one another.

9. The control apparatus according to claim 8, wherein the regulation member comprises a push button configured to rotate the arm members in directions in which the holding members come apart from one another against biasing force of the second biasing unit.

10. The control apparatus according to claim 7, wherein the holding members each comprise an elastic material.

11. The control apparatus according to claim 1, wherein an inner surface of the openable and closable door is plated at least partially.

12. The control apparatus according to claim 1, wherein the USB device comprises at least one of a USB memory and a USB cable.

13. The control apparatus according to claim 3, wherein the holding mechanism comprises a position fixing unit configured to fix the holding members at respective holding positions corresponding to a size of the housing of the USB device.

14. The control apparatus according to claim 13, wherein the holding mechanism comprises
a first biasing unit configured to bias the holding members back to predetermined reference positions at which the openable and closable door is closable, and
a fixation releasing unit configured to release the holding members fixed by the position fixing unit so as to permit the holding members to return to the respective reference positions by biasing force of the first biasing unit.

15. The control apparatus according to claim 3, wherein the holding members each comprise an elastic member at a portion of contact with the housing of the USB device.

16. A control apparatus comprising:
a port into which a connector of a USB device is insertable and from which the connector of the USB device is removable so as to connect and disconnect the USB device to and from the control apparatus;
an openable and closable door disposed adjacent the port, the openable and closable door being configured to open so as to expose the port and configured to close so as to shield the port; and
a holding mechanism disposed at the openable and closable door and configured to hold a housing of the USB device when the openable and closable door is open,
wherein the holding mechanism comprises at least two holding members behind an inner surface of the openable and closable door, the at least two holding members being configured to hold the housing of the USB device between the at least two holding members so as to support the housing of the USB device,
wherein the holding members are movable in directions in which one holding member among the holding members disposed at one side of the inner surface of the openable and closable door and another holding member among the holding members disposed at another side of the inner surface of the openable and closable door come close to and apart from one another,
wherein the holding mechanism comprises a position fixing unit configured to fix the holding members at respective holding positions corresponding to a size of the housing of the USB device, and
wherein the holding members each comprise an elastic member at a portion of contact with the housing of the USB device.

17. The control apparatus according to claim 5, wherein the holding members each comprise an elastic member at a portion of contact with the housing of the USB device.

18. The control apparatus according to claim 13, wherein the holding members each comprise an elastic member at a portion of contact with the housing of the USB device.

19. The control apparatus according to claim 14, wherein the holding members each comprise an elastic member at a portion of contact with the housing of the USB device.

20. The control apparatus according to claim 8, wherein the holding members each comprise an elastic material.

* * * * *